(12) United States Patent
Cho

(10) Patent No.: US 8,232,631 B2
(45) Date of Patent: Jul. 31, 2012

(54) SEMICONDUCTOR PACKING HAVING OFFSET STACK STRUCTURE

(75) Inventor: Yun-Rae Cho, Seoul (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 151 days.

(21) Appl. No.: 12/605,459

(22) Filed: Oct. 26, 2009

(65) Prior Publication Data

US 2010/0109143 A1     May 6, 2010

(30) Foreign Application Priority Data

Nov. 3, 2008  (KR) ................ 10-2008-0108386

(51) Int. Cl.
- *H01L 23/02* (2006.01)
- *H01L 23/48* (2006.01)
- *H01L 23/52* (2006.01)
- *H01L 29/40* (2006.01)

(52) U.S. Cl. ............... 257/686; 257/777; 257/E21.499; 257/E23.003; 257/E23.172; 257/E23.173

(58) Field of Classification Search .............. 257/686, 257/777, E21.499, E23.003, E23.172, E23.173
See application file for complete search history.

(56) References Cited

U.S. PATENT DOCUMENTS

| | | | | |
|---|---|---|---|---|
| 6,000,603 A * | 12/1999 | Koskenmaki et al. | ....... | 228/246 |
| 6,621,155 B1 * | 9/2003 | Perino et al. | ................. | 257/686 |
| 7,528,011 B2 * | 5/2009 | Yano et al. | ..................... | 438/109 |
| 7,535,091 B2 * | 5/2009 | Sung et al. | ..................... | 257/686 |
| 7,550,834 B2 * | 6/2009 | Yu et al. | ......................... | 257/686 |
| 7,582,953 B2 * | 9/2009 | Lin | ................................. | 257/666 |
| 7,622,794 B1 * | 11/2009 | Fan | ............................... | 257/666 |
| 7,838,979 B2 * | 11/2010 | Oh | .............................. | 257/686 |
| 7,859,118 B2 * | 12/2010 | Tsai | ............................ | 257/777 |
| 7,944,037 B2 * | 5/2011 | Nishiyama et al. | ........... | 257/686 |
| 2004/0142506 A1 * | 7/2004 | Corisis et al. | ................. | 438/106 |
| 2004/0164392 A1 * | 8/2004 | Lee | ............................... | 257/686 |
| 2005/0067694 A1 | 3/2005 | Pon et al. | | |
| 2006/0267173 A1 * | 11/2006 | Takiar et al. | .................. | 257/686 |
| 2006/0290005 A1 * | 12/2006 | Thomas et al. | ................ | 257/777 |
| 2007/0170573 A1 * | 7/2007 | Kuroda et al. | ................ | 257/686 |
| 2007/0218588 A1 * | 9/2007 | Takiar et al. | .................. | 438/109 |
| 2008/0036067 A1 | 2/2008 | Lin | | |
| 2008/0150111 A1 * | 6/2008 | Hiller et al. | ................... | 257/686 |
| 2008/0150158 A1 * | 6/2008 | Chin | ............................ | 257/777 |
| 2008/0174000 A1 * | 7/2008 | Chen et al. | .................... | 257/686 |
| 2008/0176358 A1 * | 7/2008 | Liu et al. | ....................... | 438/109 |
| 2008/0197472 A1 * | 8/2008 | Matsushiima | ................ | 257/686 |
| 2008/0303131 A1 * | 12/2008 | McElrea et al. | .............. | 257/686 |
| 2009/0065948 A1 * | 3/2009 | Wang | ............................ | 257/777 |
| 2009/0096075 A1 * | 4/2009 | Joh | ................................ | 257/686 |
| 2009/0096111 A1 * | 4/2009 | Fujiwara et al. | .............. | 257/777 |
| 2009/0108470 A1 * | 4/2009 | Okada et al. | .................. | 257/777 |
| 2009/0134528 A1 * | 5/2009 | Lee et al. | ...................... | 257/777 |
| 2009/0146278 A1 * | 6/2009 | Shen | ............................. | 257/676 |
| 2009/0224389 A1 * | 9/2009 | Yee et al. | ...................... | 257/686 |
| 2009/0273096 A1 * | 11/2009 | Hiew et al. | .................... | 257/777 |
| 2009/0321952 A1 * | 12/2009 | Liang et al. | ................... | 257/777 |
| 2010/0044849 A1 * | 2/2010 | Kim et al. | ..................... | 257/686 |
| 2010/0044861 A1 * | 2/2010 | Chiu et al. | .................... | 257/738 |
| 2010/0078793 A1 * | 4/2010 | Mess et al. | .................... | 257/686 |

* cited by examiner

*Primary Examiner* — Ida M Soward

(74) *Attorney, Agent, or Firm* — Stanzione & Kim, LLP

(57) ABSTRACT

A method of manufacturing a semiconductor package includes forming a protection layer on a support plate, stacking substrates on the protection layer, electrically connecting the substrates to each other, forming a molding layer on the support plate, and removing the support plate while the protection layer remains on the substrates. The stacked substrates are offset from adjacent substrates.

16 Claims, 18 Drawing Sheets

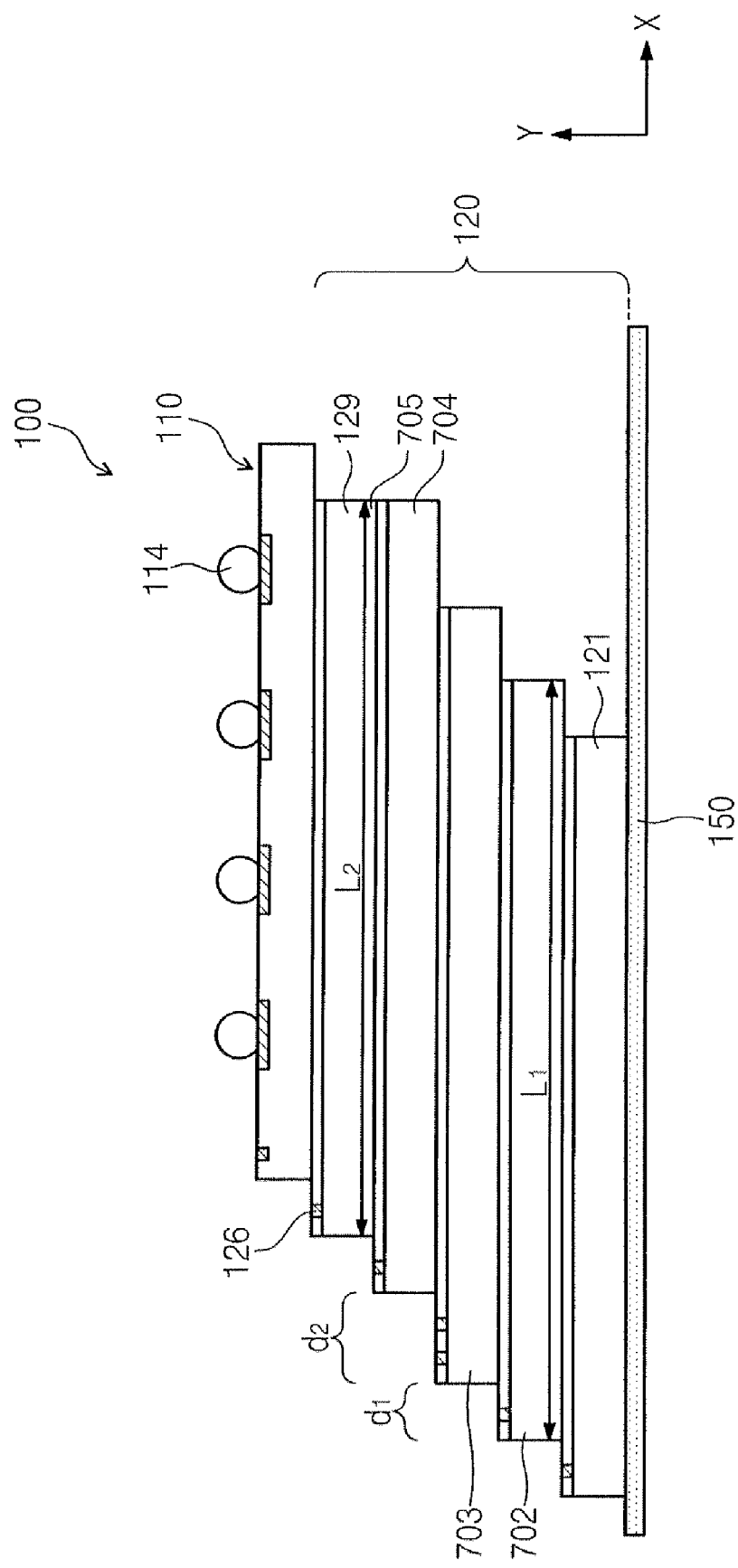

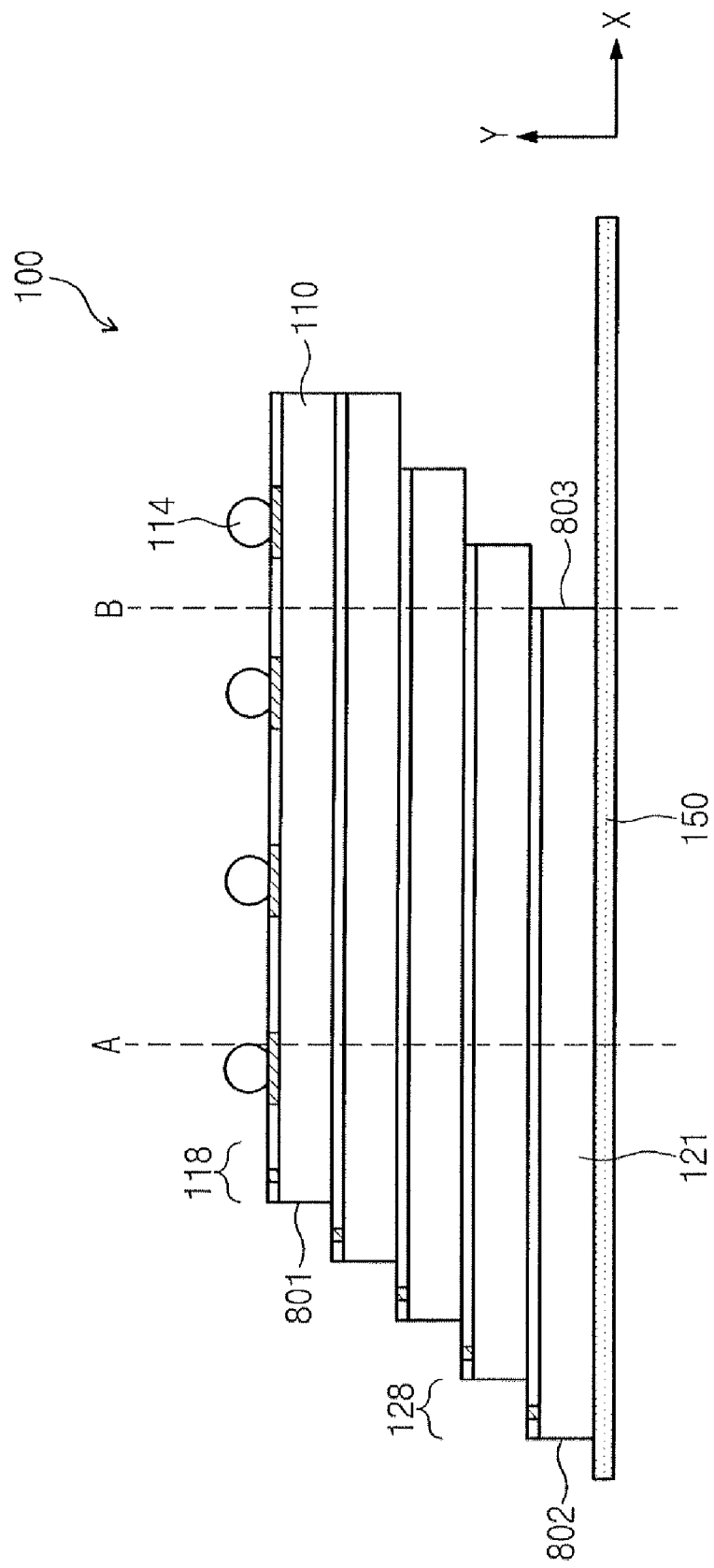

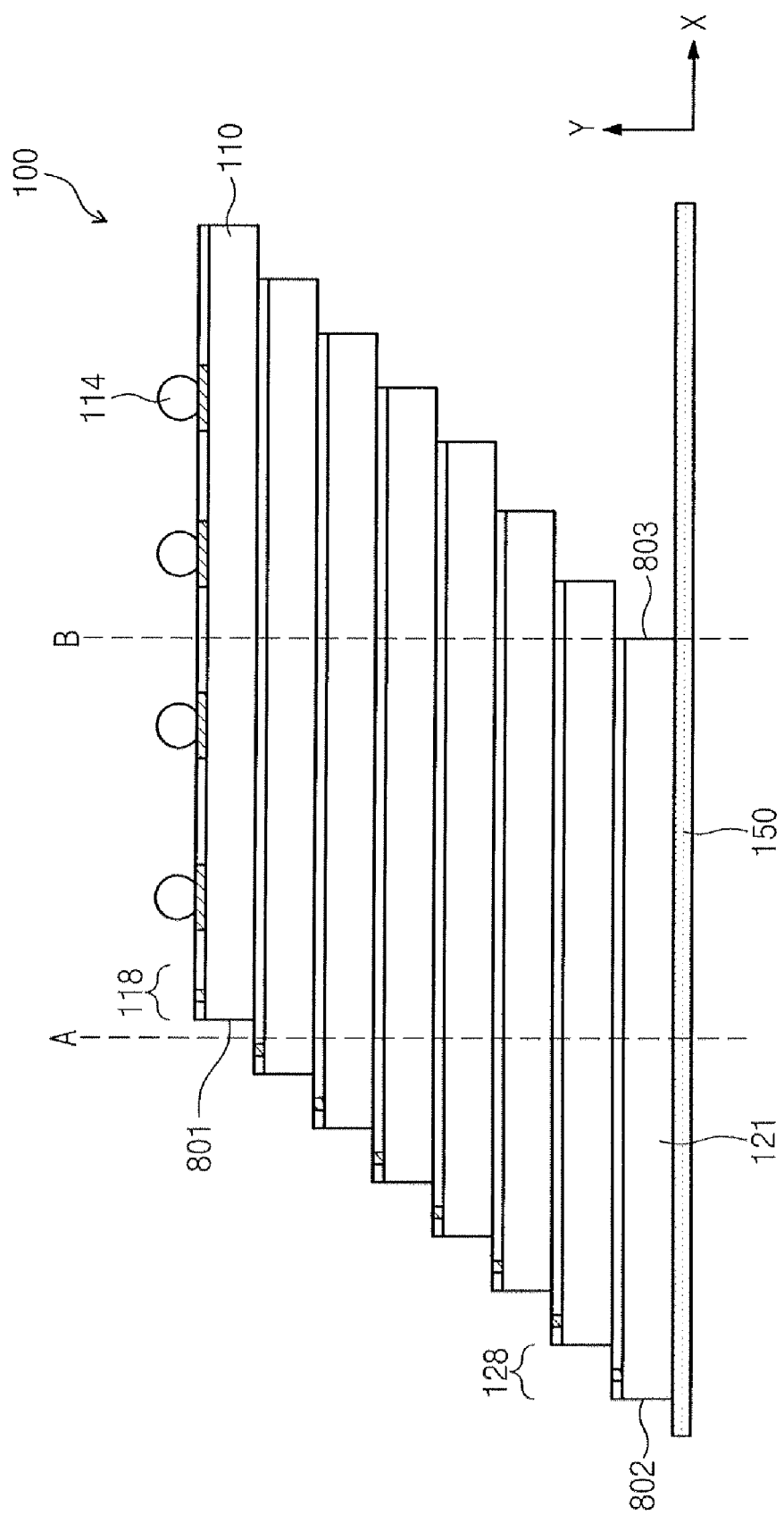

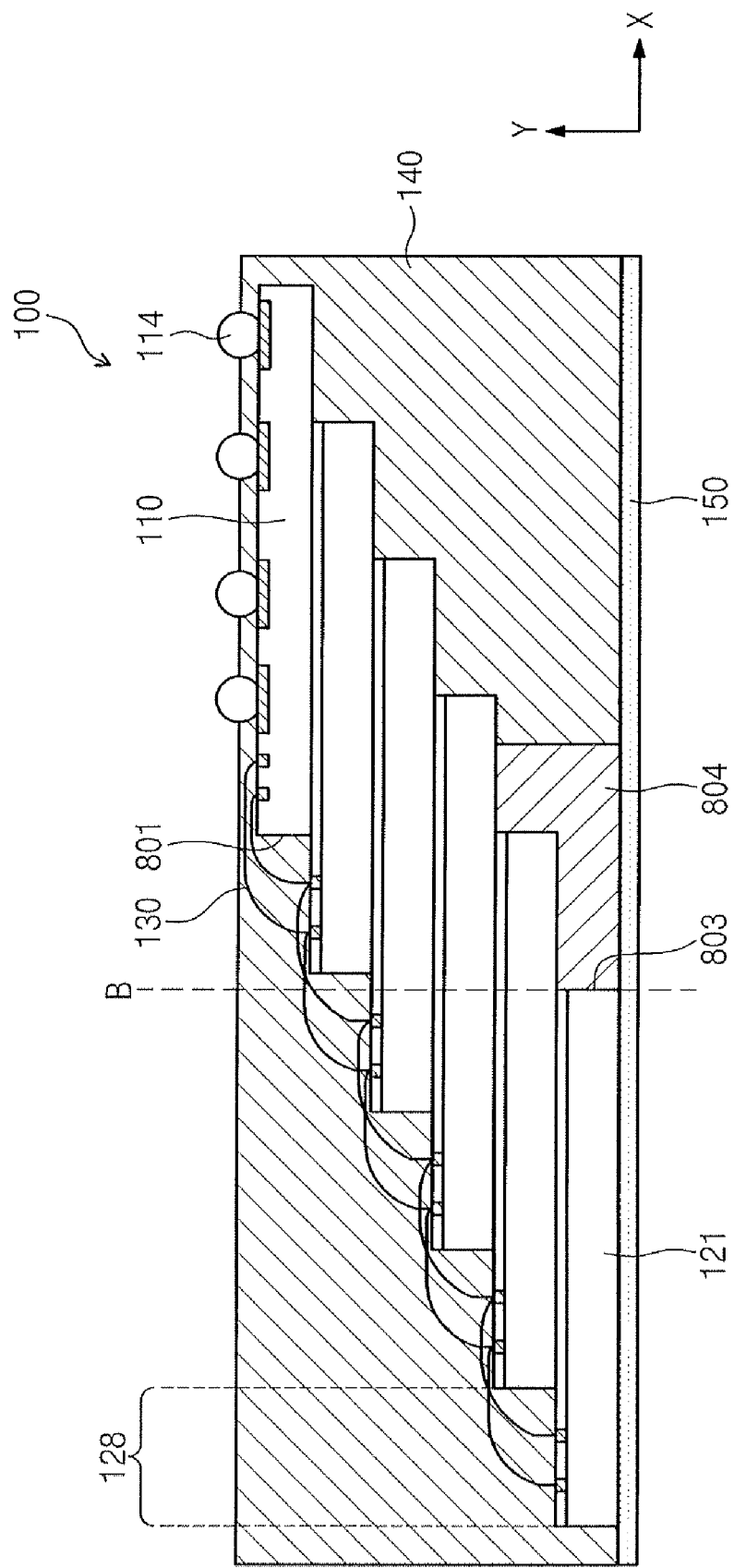

SEMICONDUCTOR PACKING HAVING OFFSET STACK STRUCTURE

CROSS-REFERENCE TO RELATED APPLICATIONS

This U.S. non-provisional patent application claims priority under 35 U.S.C. §119 of Korean Patent Application No. 2008-0108386, filed on Nov. 3, 2008, the entire contents of which are herein incorporated by reference in their entirety.

BACKGROUND

1. Field of the Invention

The exemplary embodiments disclosed herein relate to a semiconductor package, and more particularly, to a stack semiconductor package and a method of manufacturing the same.

2. Description of the Related Art

A general stack package has a structure in which a plurality of substrates is stacked one atop another. The stacked package may include stacked semiconductor chip substrates. Each of the semiconductor chip substrates may be an integrated circuit itself or a package substrate including an integrated circuit chip mounted on a printed circuit board (PCB). Connection pads may be formed in the semiconductor chip substrates. The semiconductor chip substrates may be electrically connected to each other by connecting the connection pads with a bonding wire.

However, since a general stack semiconductor package has a structure in which a plurality of semiconductor chips is stacked, it has a limitation in reducing a size of a semiconductor package. Moreover, when an interposer such as a solder bump or an printed circuit substrate (PCB) is disposed between the semiconductor chip package substrates, the stack package has a complicated interconnection structure and it is difficult to reduce a size of the stack package because each of the solder bumps and the printed circuit bumps has to be connected to interconnection patterns.

SUMMARY

Features and/or utilities of the present general inventive concept may be realized by a method of manufacturing a semiconductor package including forming a protection layer on a support plate, stacking substrates on the protection layer, electrically connecting the substrates to each other, forming a molding layer on the support plate, and removing the support plate while the protection layer remains on the substrates Additional aspects and utilities of the present general inventive concept will be set forth in part in the description which follows and, in part, will be obvious from the description, or may be learned by practice of the general inventive concept.

The stacking of the substrates may include forming a plurality of stack structures including substrates having an offset stack structure on the protection layer.

The forming of the stack structures may include stacking the substrates in the shape of a stair and stacking a base substrate including an external connection terminal on the substrates.

The stacking of the substrates in the shape of a stair may include stacking integrated circuit chip substrates, and the stacking of the base substrate may include stacking a printed circuit board on the integrated circuit chip substrates.

The stacking of the substrates may include stacking integrated circuit chip substrates.

The forming of the molding layer may include forming a molding layer covering the base substrate while surrounding a portion of the external connection terminal.

The protection layer may mold the lowermost substrate among the substrates.

After forming the molding layer, the method may further include dividing the stack structures into unit semiconductor packages.

The molding layer may be formed of resin material including epoxy molding compound and the protection layer may be formed of adhesive material including polyimide.

The electrically connecting of the substrates to each other may include forming a bonding wire electrically connecting the nearest substrates among the substrates.

Features and/or utilities of the present general inventive concept may also be realized by a semiconductor package including substrates having an offset stack structure, a bonding wire electrically connecting the substrates, a molding layer molding the substrates while exposing an inactive surface of the lowermost substrate among the substrates, and a protection layer covering the exposed inactive surface of the lowermost substrate. The inactive surface of the lowermost substrate may be coplanar with one side of the molding layer.

The uppermost substrate among the substrates may include an external connection terminal, and a portion of the external connection terminal may be covered with the molding layer and the other portion of the external connection terminal may be exposed to the outside.

The substrates may include a printed circuit board having the external connection terminal and integrated circuit chip substrates disposed between the printed circuit board and the protection layer.

The substrates may be integrated circuit chip substrates.

The substrates may be stacked in the shape of a stair so that a portion of an active surface of each of the substrates is exposed.

The bonding wire may connect the nearest substrates among the substrates.

The molding layer may include epoxy molding compound and wherein the protection layer comprises polyimide.

Features and/or utilities of the present general inventive concept may also be realized by a method of manufacturing a semiconductor package, the method including stacking a plurality of substrates on a support plate, each of the plurality of substrates being offset from each adjacent substrate, and electrically connecting the plurality of substrates.

The plurality of substrates may be offset to form a stair shape on at least one side of the plurality of substrates.

A protection layer may be located between the support plate and the plurality of substrates, and the method may further include covering the plurality of substrates in a mold, and removing the support plate and leaving the protection layer connected to the plurality of substrates.

Electrically connecting the plurality of substrates may include connecting the plurality of substrates with a wire, and covering the plurality of substrates in a mold may include entirely covering the wire in the mold.

An upper-most substrate of the plurality of substrates farthest from the protection layer may include an external connection terminal, and covering the plurality of substrates in a mold may include covering a wire connecting the upper-most substrate to an adjacent substrate and covering only a portion of the external connection terminal adjacent to an upper surface of the upper-most substrate.

Features and/or utilities of the present general inventive concept may also be realized by a method of manufacturing a semiconductor package, the method including stacking a plurality of substrates one atop another, an upper-most substrate including an external connection terminal on an upper-most surface, connecting the a connection pad on the upper-most surface of the upper-most substrate to an adjacent substrate of the plurality of substrates with a wire, and covering the upper-most surface of the upper-most substrate with a protection layer. The protection layer may cover the wire and a only a portion of the external connection terminal adjacent to the upper-most surface of the upper-most substrate.

Features and/or utilities of the present general inventive concept may also be realized by a semiconductor package including a plurality of stacked substrates electrically connected to each other, each substrate of the plurality of stacked substrates being offset from an adjacent substrate in a first direction.

Each of the plurality of stacked substrates may include a first side and a second side adjacent to the first side, the first side of each substrate may be offset from an adjacent substrate in a first direction, and the second side of each substrate may be offset from an adjacent substrate in a second direction.

The semiconductor package may further include a protection layer connected to a lower-most surface of a lower-most substrate of the plurality of stacked substrates and a mold surrounding the plurality of stacked substrates other than the lower-most surface of the lower-most substrate.

The plurality of stacked substrates may include an upper-most substrate having an external terminal connection on an upper-most surface, and the semiconductor package may further include a wire to connect a connection pad of the upper-most surface of the upper-most substrate to an adjacent substrate of the plurality of stacked substrates and a mold layer on the upper-most surface of the upper-most substrate, the mold layer covering the wire and only a portion of the external terminal connection adjacent to the upper-most surface.

Each of the plurality of stacked substrates may include a first end including a connection region to connect to an adjacent substrate and a first side facing a first direction, each of the plurality of stacked substrates may include a second side facing a direction opposite the first side, a length of each substrate being defined as a distance between the first side and the second side, the plurality of stacked substrates may include an upper-most substrate and a lower-most substrate at an opposite end of the plurality of stacked substrates as the upper-most substrate, and the first end of the upper-most substrate may be located between a mid-point of the length of the lower-most substrate and the second end of the lower-most substrate.

The plurality of stacked substrates may be offset from one another to form a stair shape in cross-section.

Features and/or utilities of the present general inventive concept may also be realized by a semiconductor package including a plurality of stacked substrates including an upper-most substrate having an upper-most surface, the upper-most surface including a connection pad and an external connection terminal to connect to an external device, a wire to connect the connection pad of the upper-most substrate to an adjacent substrate of the plurality of stacked substrates, and a mold layer on the upper-most surface, the mold layer covering the wire and only a portion of the external connection terminal adjacent to the upper-most surface.

The upper-most substrate may include wiring to connect the connection pad to the external connection terminal.

The mold layer may cover a portion of the external connection terminal between 25% and 50% of the height of the external connection terminal.

Features and/or utilities of the present general inventive concept may also be realized by a computing device including a memory device and a controller. The memory device may include a plurality of stacked substrates electrically connected to each other, each substrate of the plurality of stacked substrates being offset from an adjacent substrate in a first direction. The controller may be electrically connected to an upper-most substrate of the plurality of stacked substrates to access each of the plurality of stacked substrates.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which:

FIG. 7 illustrates stacked substrates according to an embodiment of the present general inventive concept;

FIGS. 8A-8C illustrate stacked substrates according to an embodiment of the present general inventive concept.

DETAILED DESCRIPTION OF THE EMBODIMENTS

Figure 1:
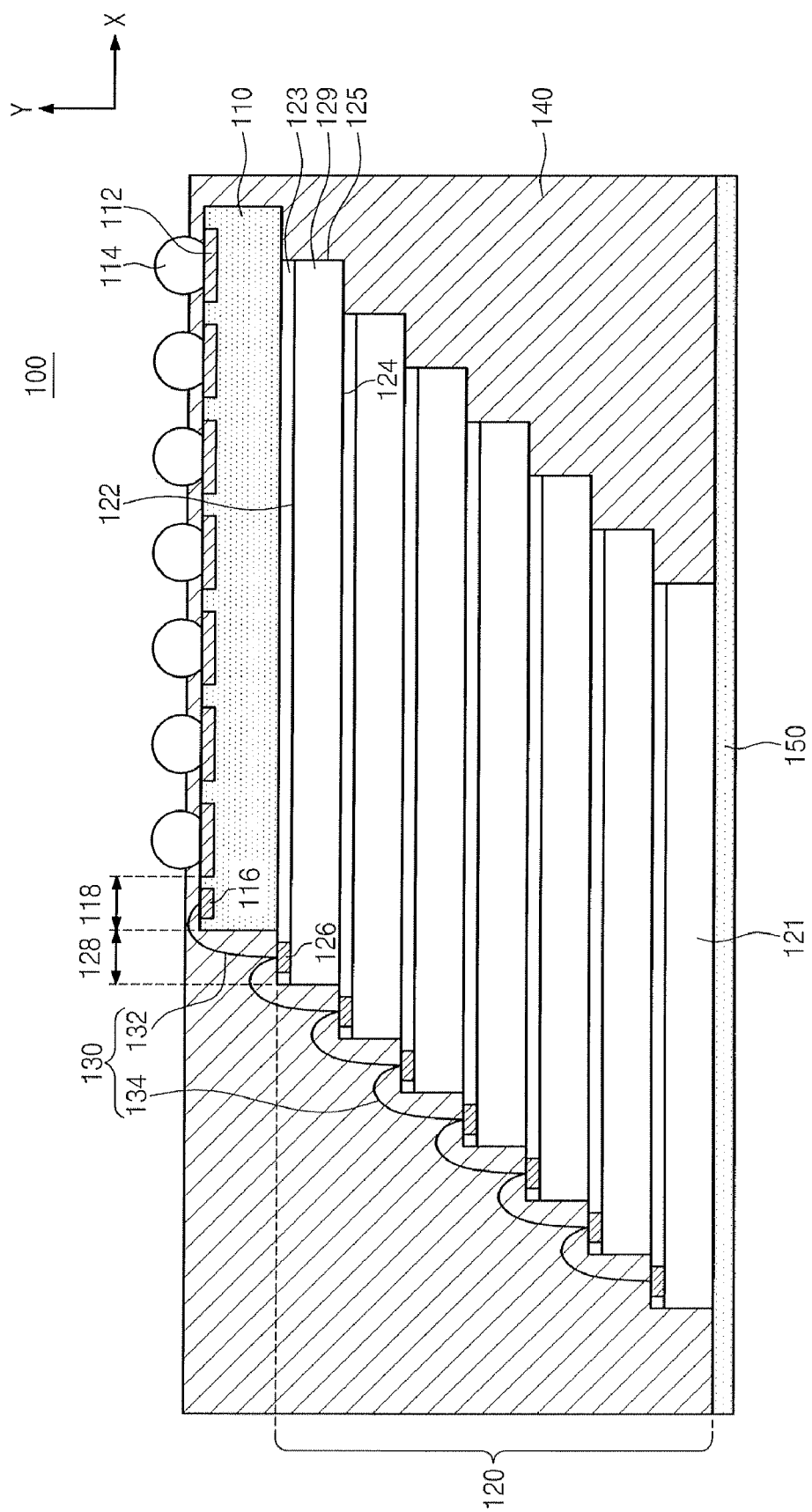
FIG. 1 is a drawing of a semiconductor package in accordance with an embodiment of the present general inventive concept.

The present general inventive concept now will be described more fully hereinafter with reference to the accompanying drawings, in which embodiments of the present general inventive concept are shown. This general inventive concept may, however, be embodied in many different forms and should not be construed as limited to the embodiments set forth herein. Rather, these embodiments are provided so that this disclosure will be thorough and complete and will fully convey the scope of the general inventive concept to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting of the general inventive concept. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the present general inventive concept may be described with reference to cross-sectional illustrations, which are schematic illustrations of idealized embodiments of the present general inventive concept. As such, variations from the shapes of the illustrations, as a result, for example, of manufacturing techniques and/or tolerances, are to be expected. Thus, embodiments of the present general inventive concept should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present general inventive concept.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present.

Spatially relatively terms, such as "beneath," "below," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented (rotated 90 degrees or at other orientations) and the spatially relative descriptors used herein interpreted accordingly. As used herein, "height" refers to a direction that is generally orthogonal to the faces of a substrate.

FIG. 1 is a drawing of a semiconductor package in accordance with an embodiment of the present general inventive concept.

Referring to FIG. 1, a semiconductor package 100 according to an embodiment of the present general inventive concept may include a plurality of substrates, a bonding wire 130 electrically connecting the substrates, and a molding layer 140 covering the substrates and the bonding wire 130.

The substrates may include a first substrate 110 and multiple second substrates 120. The first substrate 110 may include a base substrate electrically and directly connected to an external device (not shown). For example, the first substrate 110 may include a printed circuit board (PCB). The first substrate 110 may include an external connection pad 112 formed on a front side of the first substrate 110 and an external connection terminal 114 joined to the external connection pad 112. The external connection terminal 114 may be used as an interposer for connecting the semiconductor package 100 to an external device (not shown). The external connection terminal 114 may include a solder ball, for example. A connection region 118 in which a first connection pad 116 is formed may be provided to an edge of a front side of the first substrate 110. The first connection pad 116 may be electrically connected to the external connection terminal 114 by an interconnection pattern (not shown) formed on the first substrate 110. The first substrate 110 may be located adjacent to an upper surface of an upper second substrate 129 of the plurality of second substrates 120. In other words, the second substrate 120 closest to the first substrate 110 is described herein as the uppermost second substrate 129.

The second substrates 120 may include electrical devices. For example, the second substrates 120 may include integrated circuit chips. Each of the second substrates 120 may include an active surface 122, an inactive surface 124 facing the active surface 122, and a side surface 125. A redistributed interconnection 123 may be formed on the active surface 122. A connection region 128 in which a second connection pad 126 is formed may be provided to an edge of the active region 122. The second connection pad 126 may be electrically connected to the redistributed interconnection 123. The redistributed interconnection 123 may then connect the second connector pad 126 to a lead on the active surface 122 of the second substrate 120.

The second substrates 120 may have an offset stack structure on the first substrate 110. For example, the second substrates 120 may be sequentially stacked on a back side of the first substrate 110 so that respective active surfaces 122 of the second substrates 120 are out of line with adjacent second substrates 120. In addition, the second substrates 120 may be disposed to have a stair shape. Thus, the first connection pad 116 and the second connection pads 126 formed on the first and second substrates 110 and 120 respectively may be exposed.

The bonding wire 130 can electrically connect the first and second substrates 110 and 120 through the connection regions 118 and 128 provided to the first and second substrates 110 and 120. For example, the bonding wire 130 may include a first bonding wire 132 connecting the first connection pad 116 and the second connection pad 126 and a second bonding wire 134 connecting second connection pads 126 of the second substrates 120 having different heights.

The molding layer 140 may protect the semiconductor package 100 from an external chemical/physical environment and may provide support to the offset second substrates 110. The molding layer 140 may be formed to cover a portion of the external connection terminal 114. For example, the molding layer 140 may be formed to cover an entire surface of the first substrate 110 while surrounding a lower circumference of the external connection terminal 114. Accordingly, an upper portion of the external connection terminal 114 may be exposed to the outside and a lower portion of the external connection terminal 114 may be covered with the molding layer 140. The molding layer 140 covers and protects the lower portion of the external connection terminal 114, thereby improving a solder joint reliability of the external connection terminal 114. In addition, the molding layer 140 may be formed to cover the first and second substrates 110 and 120 and the bonding wire 130. The molding layer 140 may be formed of material including resin. For example, the molding layer 140 may be formed of epoxy molding compound (EMC).

The semiconductor package 100 may further include a protection layer 150 covering the inactive surface 124 of the second substrate (hereinafter it is referred to as the lowermost substrate 121) located farthest from the first substrate 110. The protection layer 150 and the molding layer 140 may together protect the semiconductor package. That is, the protection layer 150 may be formed to cover the inactive surface 124 of the lowermost substrate 121 and the molding layer 140 may be formed to cover the first and second substrates 110 and 120 and the bonding wire 130. Thus, the semiconductor package 100 can be protected from an external chemical/physical environment by the molding layer 140 and the protection layer 150. The protection layer 150 may be formed of material including resin. For example, the protection layer 150 may include polyimide film. The protection layer 150 may also include ultraviolet curable resin or thermoplastic resin. The protection layer 150 may be located only under the lower-most substrate 121 or it may extend from the ends of the lower-most substrate 121, as illustrated in FIG. 1, to provide a base or support for the semiconductor package 100.

The first substrate 110 may be a printed circuit board and the second substrates 120 may be substrates having integrated circuit chips. However, the substrates may include various types of semiconductor substrates. For example, all of the first and second substrates may have integrated circuit chips. In this case, each of the substrates may be a printed circuit board having an integrated circuit chip mounted thereon. The substrates may have the same size and shape, or may have varying shapes and lengths.

A manufacturing process of a semiconductor package according to an embodiment of the present general inventive concept is described in greater detail below. The description of features already discussed in above the semiconductor package may be omitted or simplified.

FIGS. 2A through 2F are drawings illustrating a manufacturing process of the semiconductor package depicted in FIG. 1.

Figure 2A:
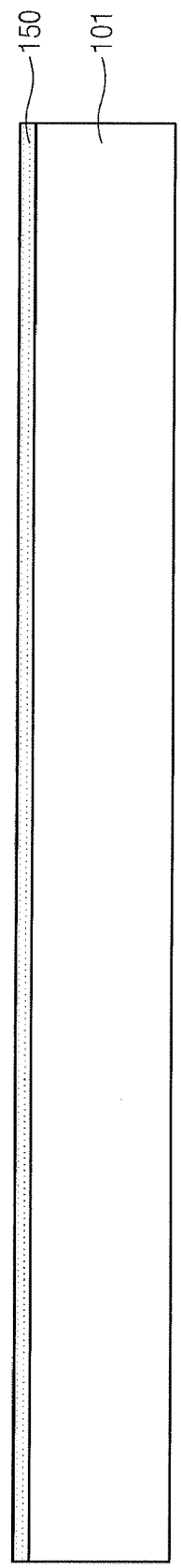
FIGS. 2A through 2F are drawings illustrating a manufacturing process of the semiconductor package depicted in FIG. 1.

Referring to FIG. 2A, a support plate 101 may be prepared. The support plate 101 may be a base substrate to manufacture a semiconductor package according to an embodiment of the present general inventive concept. A protection layer 150 may be attached onto the support plate 101. The protection layer 150 may protect inactive surfaces of the second substrates (120 of FIG. 2B). In addition, the protection layer 150 may attach a second substrate 120 to the support plate 101. The protection layer 150 can be formed of material capable of protecting the second substrate 120 and attaching the second substrate to the support plate 101. For example, the protection layer 150 may include polyimide film.

Figure 2B:
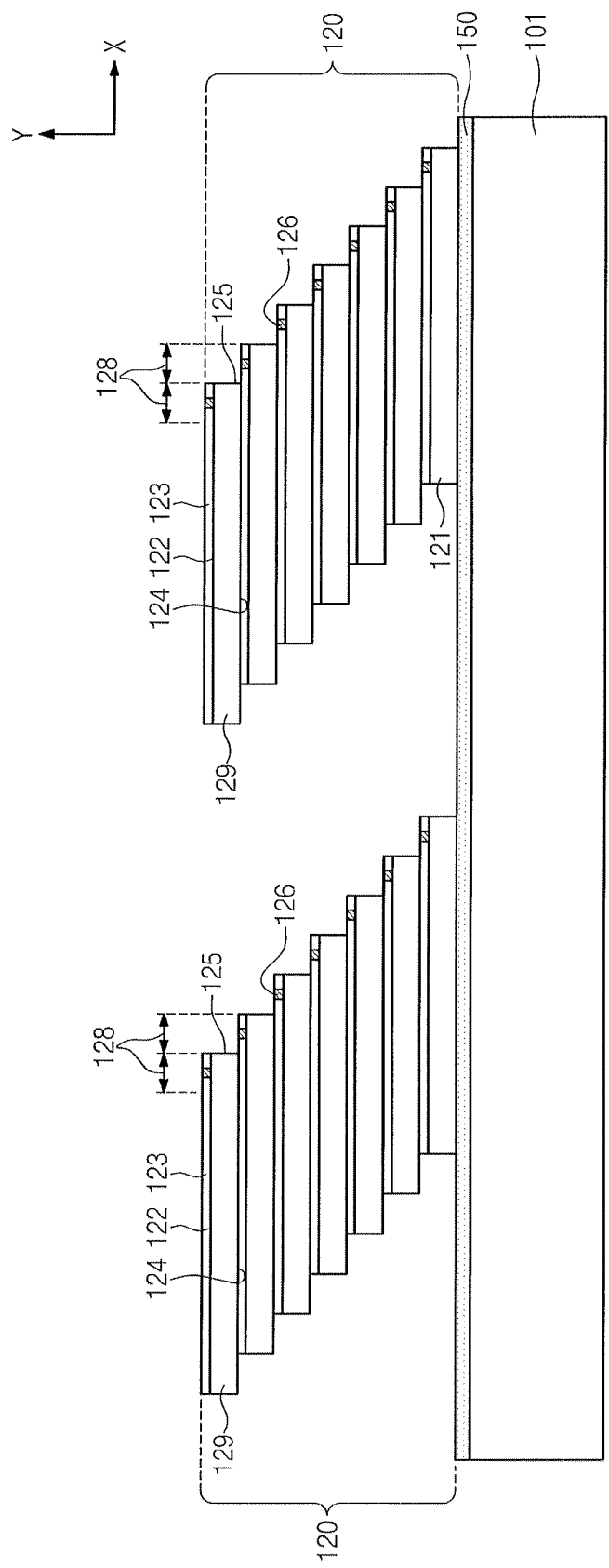

Referring to FIG. 2B, second substrates 120 may be stacked on the support plate 101. The second substrates 120 may include integrated circuit chips or other semiconductor chips, for example. The second substrates 120 may include an active surface 122, an inactive surface 124 facing the active surface 122 and a side surface 125. The active surface may be a surface having lead to electrically communicate with other chips or devices. A redistributed interconnection 123 may be formed on the active surface 122. The redistributed interconnection region 123 may include electrical leads to connect to leads of the active surface of the second substrates 120 and wires to transmit data, power, or heat from the leads of the second substrates 120 to a connection region 128 of the second substrates. The connection region 128 in which a second connection pad 126 is formed may be provided on an edge of the active surface 122 to electrically connect the second substrate 120 to another device. An adhesion layer (not shown) may be disposed between respective second substrates 120 and/or between a second substrate 120 and an adjacent redistributed region 123. When an adhesion layer is used, the second substrates 120 can be stacked without an extra interposer, such as the interconnection region 123. For example, the second substrates 120 can be stacked by interposing the adhesion layer without using a printed circuit board (PCB) and a solder bump to connect the second substrate 120 to another device.

The stacked second substrates 120 may form an offset stack structure. For example, a plurality of the second substrates 120 may be stacked on the support plate 101 so that respective portions of the active surface 122 of the second substrates 120 are exposed. The second substrates 120 may be stacked to have a stair shape. In other words, a connection region 128 of each second substrate 120 may be offset in a direction x from each adjacent second substrate 120, so that the connection regions 128 of the second substrates 128 form a shape of a stair. Thus, the second substrates 120 may be disposed so that respective active surfaces 122 of the second substrates 120 are out of line and the second connection pads 126 formed on respective connection regions 128 of the second substrates 120 may be exposed.

The second substrate 120 closest to the protection layer 150 is referred to below as the lower-most second substrate 121, and the second substrate 120 farthest from the protection layer 150 is referred to below as the upper-most second substrate 129.

Figure 2C:
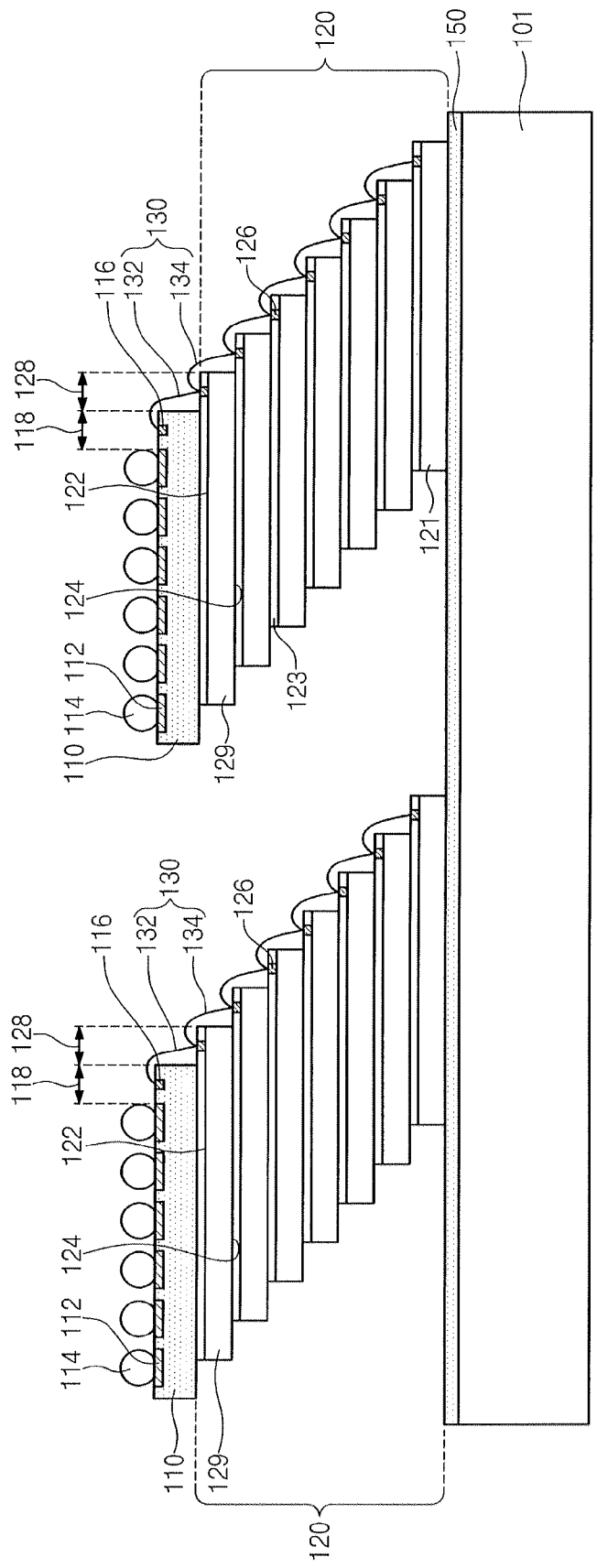

Referring to FIG. 2C, a first substrate 110 may be stacked on the second substrates 120. The first substrate 110 may include a base substrate for an electrical connection to an external device (not shown). The first substrate 110 may be arranged so that a side of the first substrate 110 facing the direction x is offset from a side of the second substrates 120 also facing the direction x. Thus, the first and second substrates 110 and 120 together may form a stair-shaped stack structure on the support plate 101. The first substrate 110 may include a printed circuit substrate formed on the front side of the first substrate 110, or a side farthest from the protection layer 150 in the direction y. The printed circuit substrate may include an external connection pad 112, for example. Alternatively, the first substrate 110 may include an integrated circuit chip substrate on the front side of the first substrate 110. The integrated circuit chip substrate may include the external connection pad 112. An external connection terminal 114 may be formed on the external connection pad 112. A connection region 118 having a first connection pad 116 may be provided at an edge of the front side of the first substrate 110.

A bonding wire 130 may be formed to electrically connect the first and second substrates 110 and 120. Forming the bonding wire 130 may include forming a first bonding wire 132 connecting the first connection pad 116 to the second connection pad 126 of the second substrate 120 adjacent to the first substrate 110 and forming a second bonding wire 134 connecting second connection pads 126 of the second substrates 120.

Figure 2D:
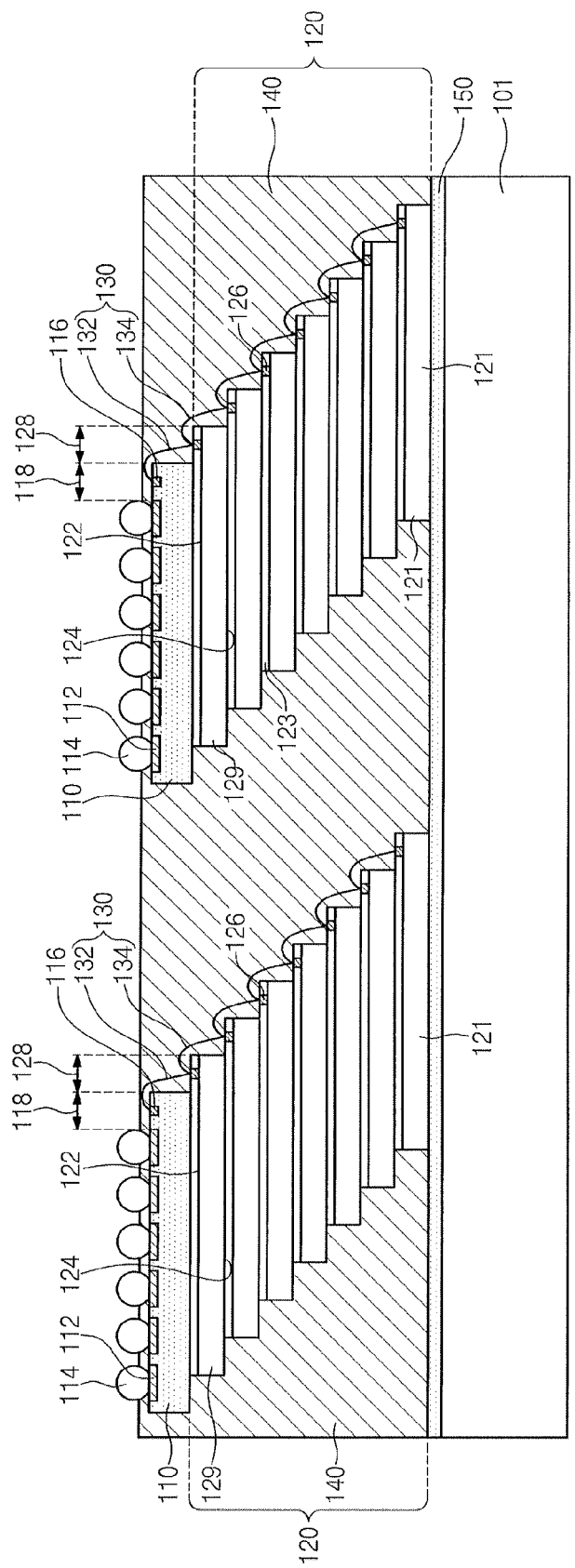

Referring to FIG. 2D, a molding layer 140 may be formed on the protection layer to cover the first and second substrates 110 and 120 and the bonding wire 130. Forming the molding layer 140 may include placing a die (not shown) on the first and second substrates 110 and 120, injecting molding material into a space between the support plate 101 and the die, and separating the die from the support plate 101. A process of forming the molding layer 140 may be performed under a process condition having a temperature of 100° C. to 150° C. The molding material may include resin or an epoxy molding compound (EMC).

The molding layer 140 may cover a portion of the external connection terminal 114, while leaving a portion uncovered. For example, the molding layer 140 may cover an entire surface of the first substrate 110 while surrounding a lower circumference of the external connection terminal 114. Thus, an upper portion of the external connection terminal 114 may be exposed and a lower portion of the external connection terminal 114 may be covered with the molding layer 140. A thickness of the molding layer 140 covering the first substrate 110 may be formed to a minimum thickness capable of covering the first bonding wire 132, for example. If the molding layer 140 covering the surface of the first substrate 110 is too thick, then a joint reliability between the external connection terminal 114 and an external device (not shown) may be degraded.

Figure 2E:
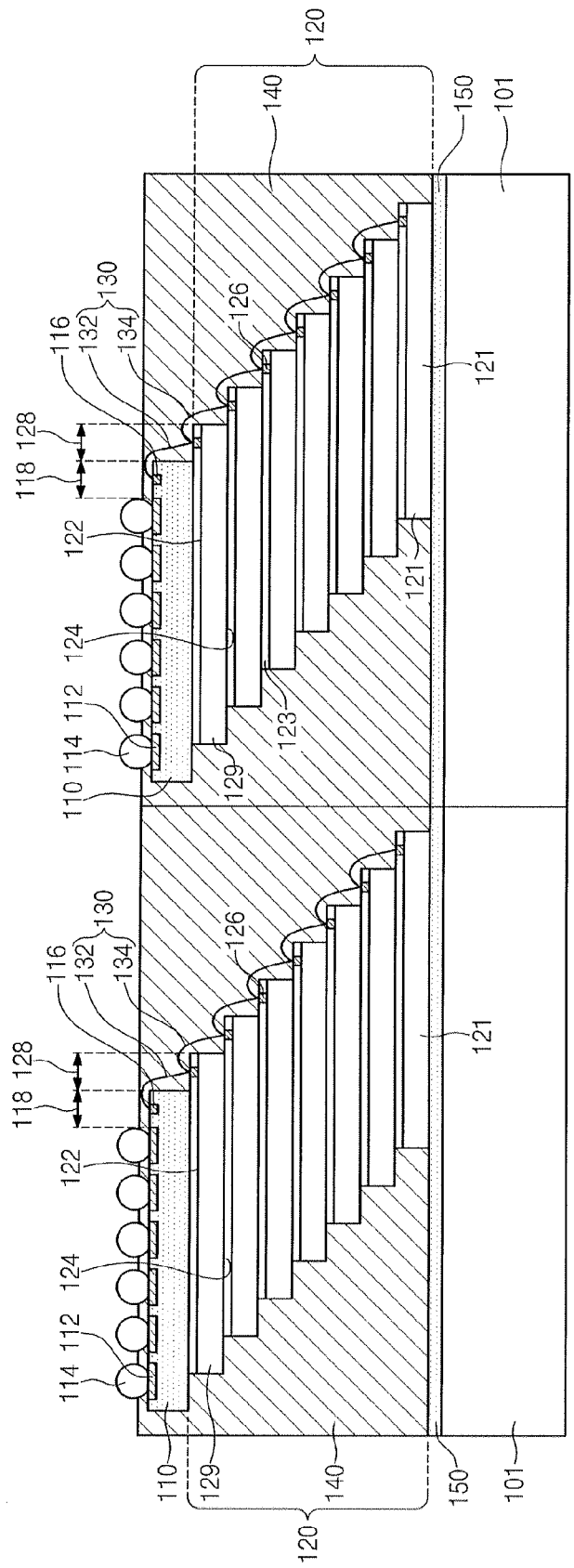

Referring to FIG. 2E, stack structures including the first and second substrates 110 and 120 can be divided into individual semiconductor packages. At this time, the support plate 101 and the protection layer 150 may also be cut from the second substrates 120 and the molding 140. A process dividing the stack structures into separate semiconductor packages can be performed using a sawing wheel or a laser, for example.

Figure 2F:
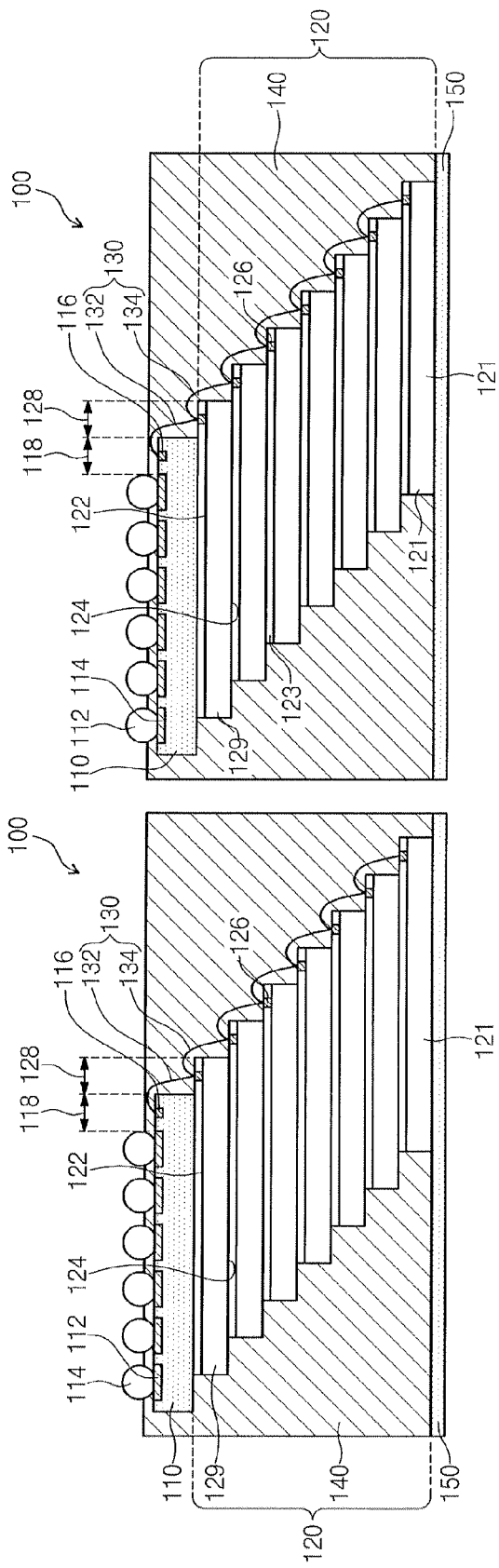

FIG. 2F shows the separated semiconductor packages 100 having the support plate 101 removed. The support plate 101 may be removed before dividing the stack structure into a unit stack structure. Alternatively, removing the support plate 101 may be performed after dividing the stack structure into separate semiconductor packages 100. In such a case, the support plate 101 may be removed while the protection layer 150 remains on the second substrate 120. The protection layer 150 may be provided to cover a back side of the lower-most substrate 121. Accordingly, the protection layer 150 may protect the second substrates 120 from an external chemical/physical environment. Leaving the protection layer 150 on the inactive surface 124 of the lower-most substrate 121 eliminates the need to provide an additional molding layer to protect the second substrates 120 after the support plate 101 is removed.

As described above, the semiconductor package 100 according to the present general inventive concept includes the first and second substrates 110 and 120 having an offset stack structure of a stair shape. Forming the stack structure of substrates 110 and 120 simplifies the structure of the semiconductor package 100, so a size of the semiconductor package 100 may be reduced. Also, forming the molding layer 140 to surround a lower circumference of the external connection terminal 114 protects the first substrate 110 and the first bonding wire 132 while improving solder joint reliability of the external connection terminal 114.

Figure 3:
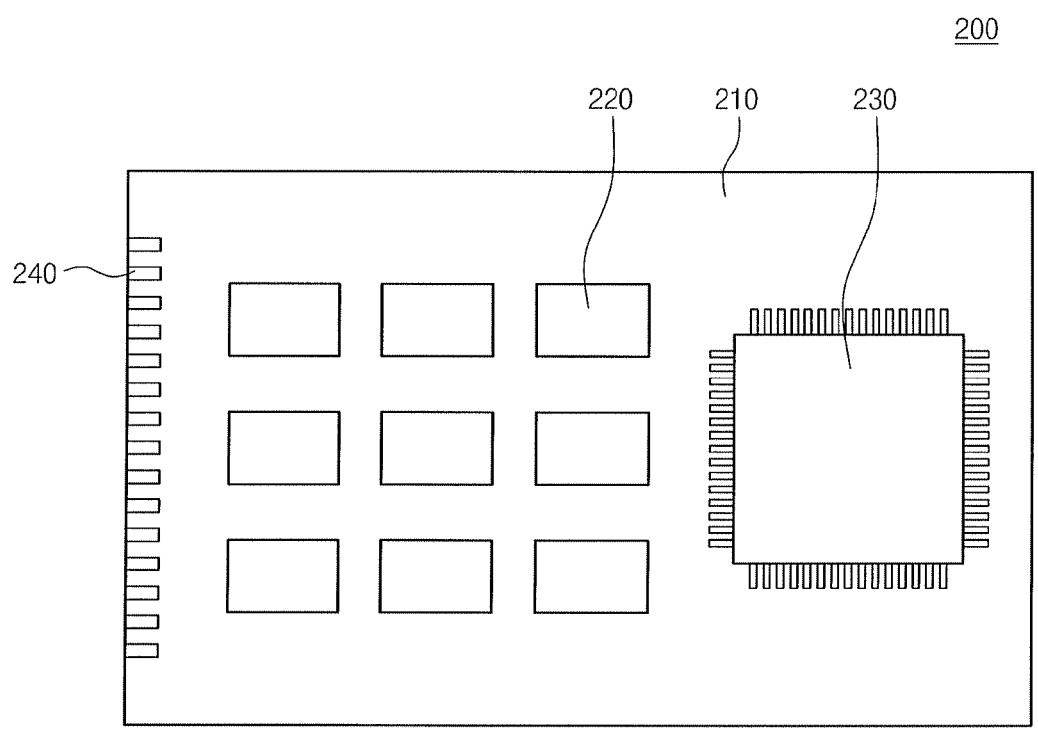
FIG. 3 is a drawing of an example of a package module including a semiconductor package in accordance with the present general inventive concept.

The semiconductor package technique may be applied to various kinds of semiconductor devices and a package module including a semiconductor device. FIG. 3 is a drawing illustrating an example of a package module including a semiconductor package to which a technique of the present general inventive concept may be applied. Referring to FIG. 3, a package module 200 may be provided in the shape of a semiconductor integrated circuit chip 220 and a semiconductor integrated circuit chip 230 packaged in the type of a quad flat package (QFP). The package module 200 may be formed by installing the semiconductor devices 220 and 230 to which a technique of the present general inventive concept is applied in a substrate 210. The package module 200 can be connected to an external electronic device through an external connection terminal 240 located on one side of the substrate 210.

Figure 4:
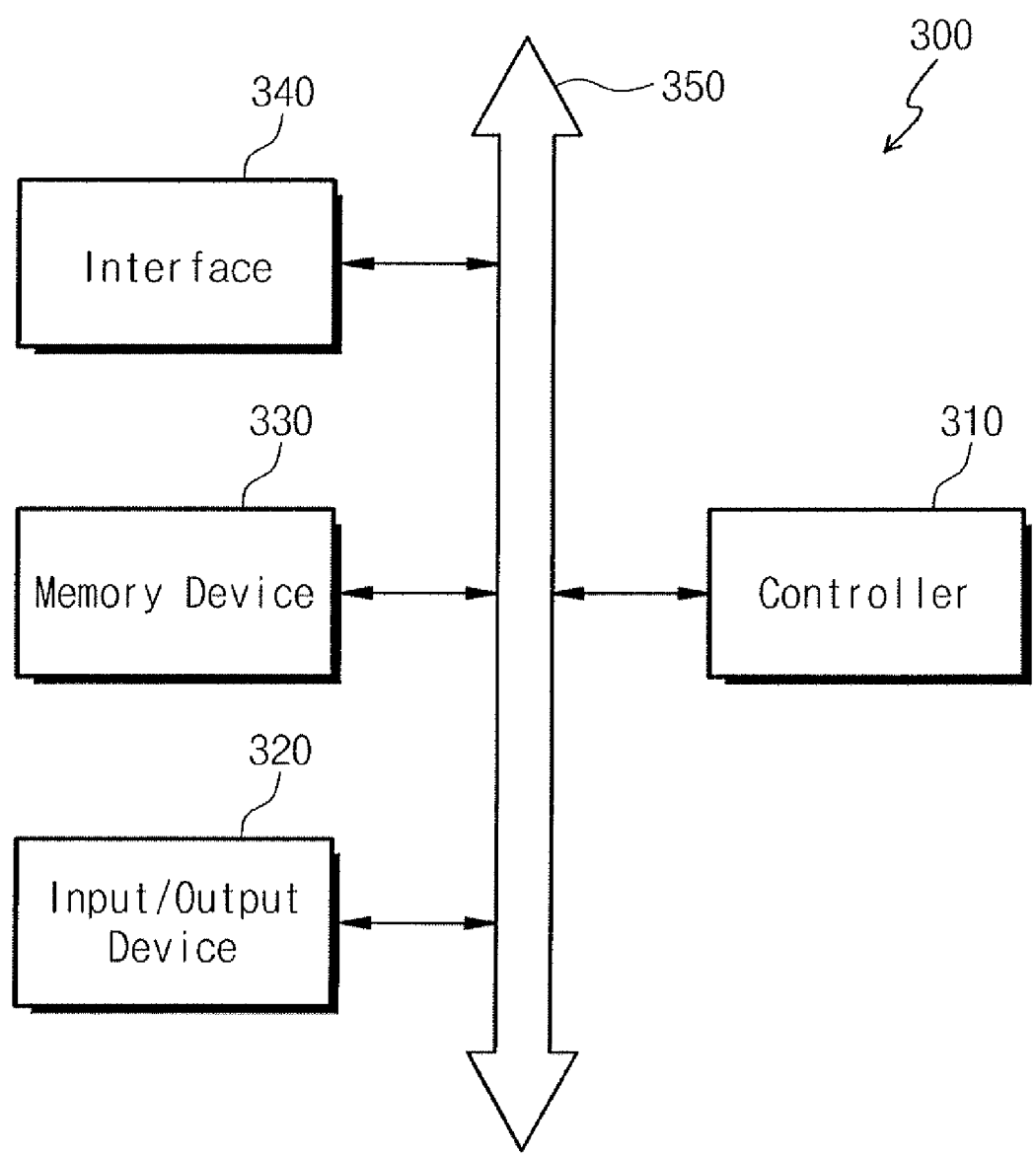
FIG. 4 is a block diagram of an electronic device including a semiconductor package in accordance with the present general inventive concept.

The semiconductor package technique described above may also be applied to an electronic system or device, such as a computing device. FIG. 4 is a block diagram illustrating an electronic device including a semiconductor package to which a technique of the present general inventive concept is applied. An electronic system 300 may include a controller 310, an input/output device 320, and a memory device 330. The controller 310, the input/output device 320, and the memory device 330 may be connected to each other through a bus 350. The bus 350 may be a data transfer path. The controller 310 may include at least one of a microprocessor, a digital signal processor, a microcontroller, and a logic device. The controller 310 and the memory device 330 may include a semiconductor package according to the present general inventive concept. The input/output device 320 may include a keypad, a keyboard, and a display device, for example. The memory device 330 may be a data storage device. The memory device 330 may store data and/or an instruction executed by the controller 310. The memory device 330 may include a volatile memory device and/or a nonvolatile memory device, for example. The memory device 330 may be formed of a flash memory. For example, a flash memory to which a technique of the present general inventive concept is applied may be built in a data processing system such as a mobile device or a desktop computer. The flash memory may be formed of a semiconductor disc device (SSD). In this case, the electronic system 300 can stably store very large amounts of data in the flash memory system. The electronic system 300 may further include an interface 340 to transmit data to a communication network or receiving data from a communication network. The interface 340 may be a wired or wireless connection. The interface 340 may include an antenna or other wireless transceiver or a wire connector. The electronic system may further include an application chip set, a camera image processor (CIS), and an input/output device.

The electronic system 300 may be embodied by a mobile system, a personal computer, an industrial computer, or a logic system performing a variety of functions. For example, the mobile system may be one of a personal digital assistant (PDA), a portable computer, a web tablet, a mobile phone, a wireless phone, a laptop computer, a memory card, a digital music system, and a data transmission/receipt system. If the electronic system 300 can perform wireless communication, the electronic system 300 may be used in a communication interface protocol of a third generation such as CDMA, GSM, NADC, E-TDMA, and CDMA2000.

Figure 5:
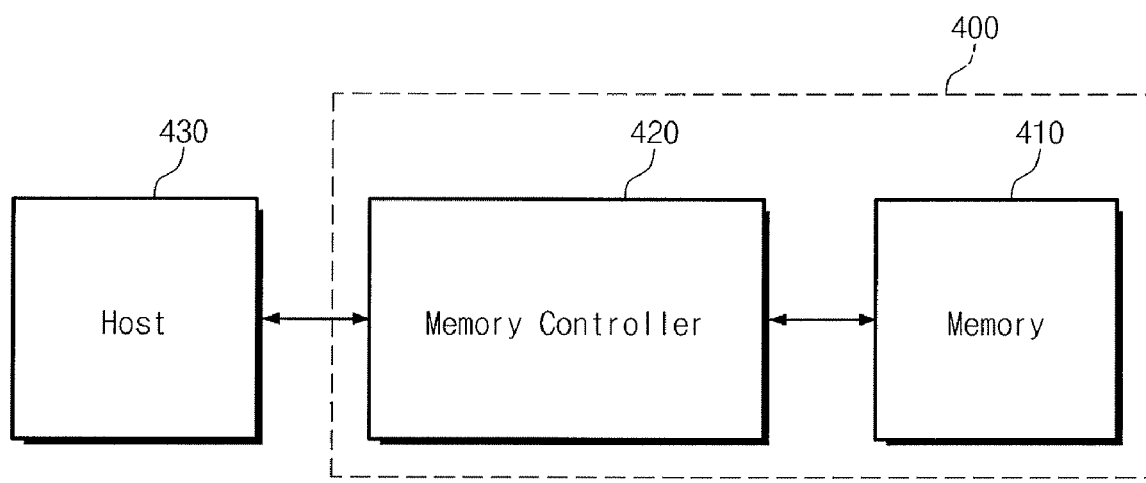
FIG. 5 is a block diagram of a memory system including a nonvolatile memory device to which a technique of the present general inventive concept is applied

The present general inventive concept may also be applied to a semiconductor device used in a memory card. FIG. 5 is a block diagram illustrating an example of a memory system including a semiconductor device to which the technique of the present general inventive concept is applied. A memory card 400 may include a nonvolatile memory device 410 and a memory controller 420. The nonvolatile memory device 410 and the memory controller 420 can store data or decode stored data. The nonvolatile memory device 410 may include at least one nonvolatile memory device to which a technique of a semiconductor package according to the present general inventive concept is applied. The memory controller 420 can control the nonvolatile memory device 410 to read stored data or to write data in response to a request of decoding/writing of a host 430.

Figure 6A:
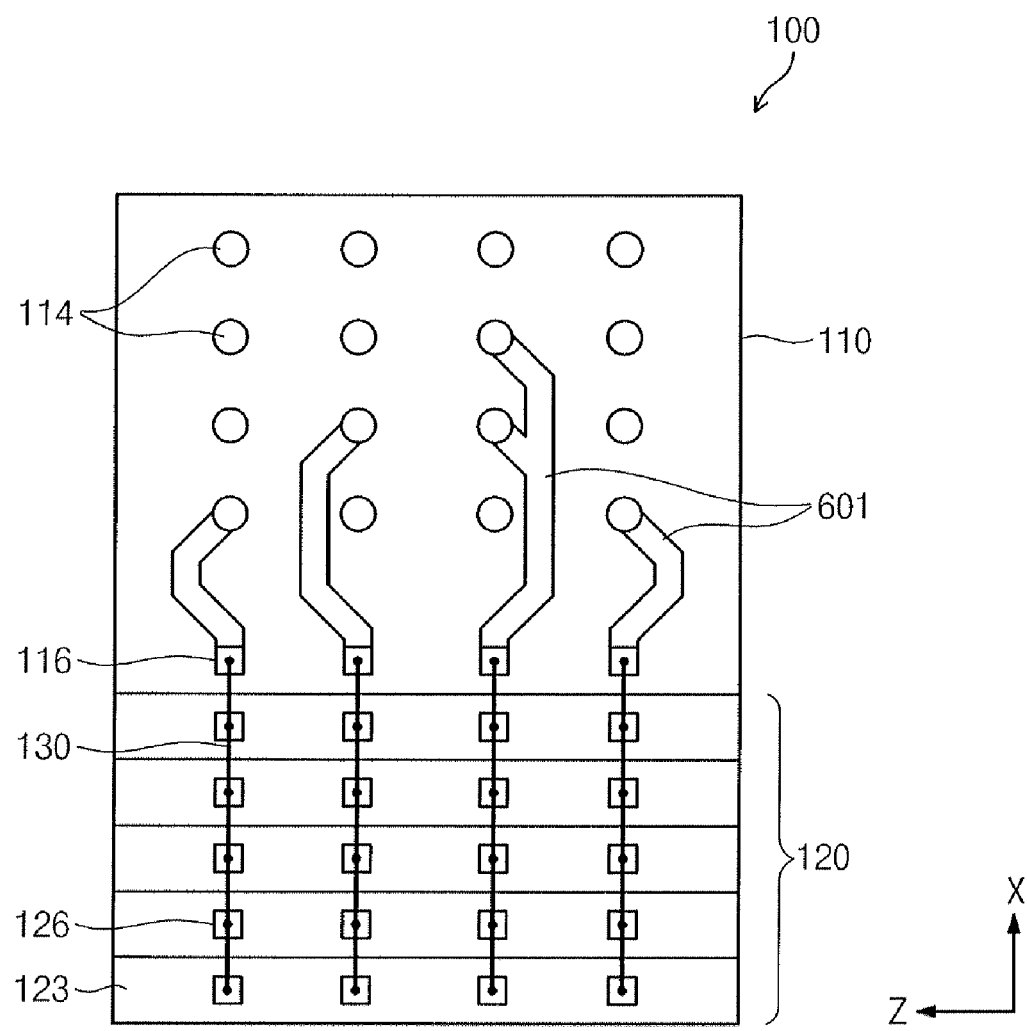
FIGS. 6A-6C illustrate configurations of stacked substrates according to the present general inventive concept.
Figure 6B:
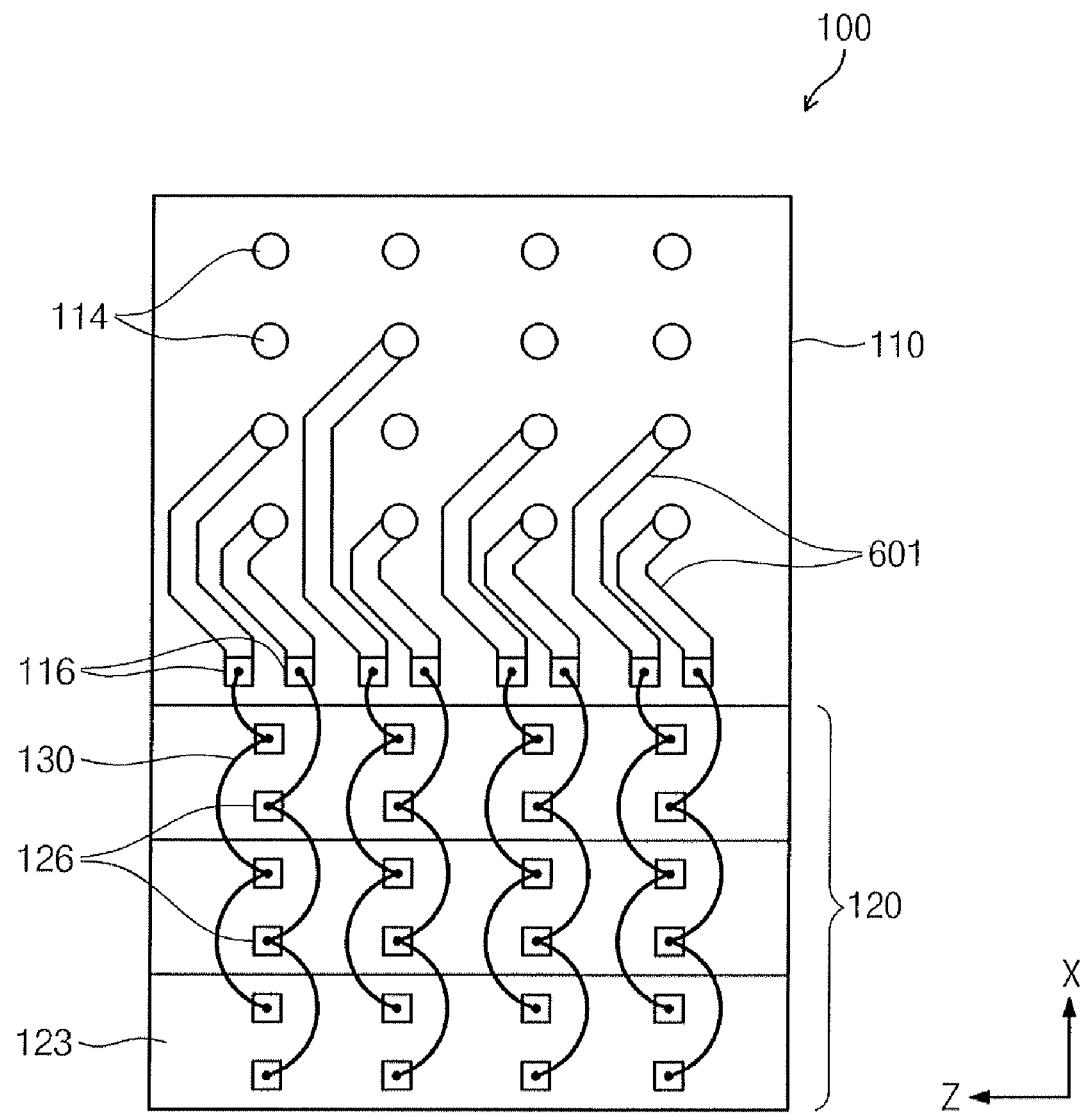
Figure 6C:
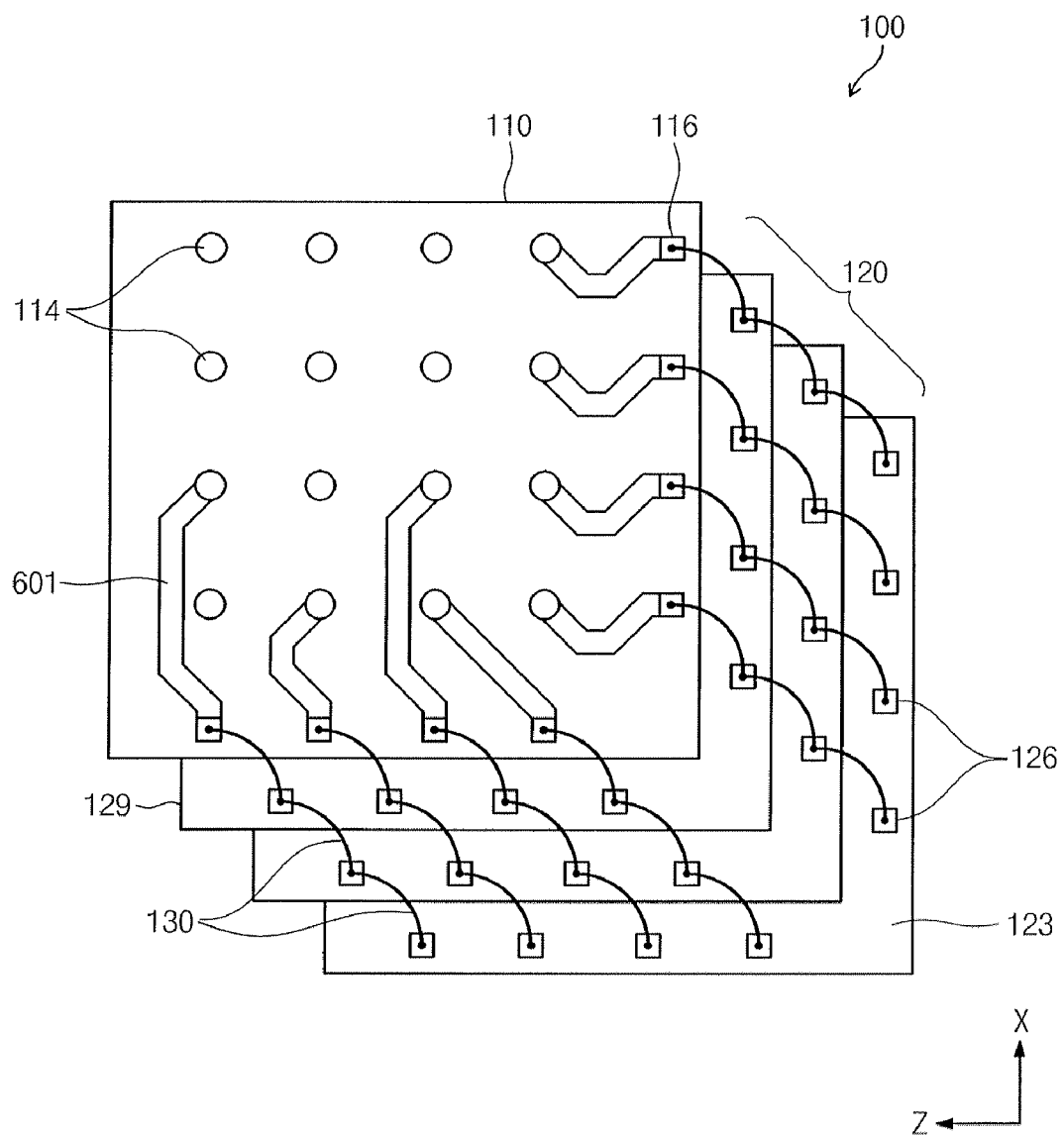

FIGS. 6A-6C illustrate configurations of a stacked semiconductor package 100 according to the present general inventive concept. FIGS. 6A-6C may be examples showing top plan views of FIG. 1 in two directions, x and z. The direction z may be perpendicular to each of the directions x and y. As illustrated in FIG. 6A, the first substrate 110, or top substrate in the y direction of FIG. 1, may be aligned with the second substrates 120. As discussed previously, the first substrate 110 may include first connection pads 116 and external connection terminals 114. The first substrate 110 may further include wiring 601 to connect one or more of the first connection pads 116 to one or more of the connection terminals 114. A wiring 601 may be inside the first substrate 110, or it may be on a surface of the first substrate 110.

The second substrates 120 may be arranged so that only one second connection pad 126 of each second substrate 120 is exposed. The second connection pads 126 may be formed in a redistributed interconnection layer 123. The first connection pads 116 may be connected to the second connection pads 126, and the second connection pads 126 may be connected to each other, via bonding wires 130.

FIG. 6B is similar to FIG. 6A, but multiple second connection pads 126 are exposed on each second substrate 120.

FIG. 6C illustrates a stacked semiconductor package 100 similar to the semiconductor packages of FIGS. 6A and 6B, but in FIG. 6C each substrate 110, 120 is offset from each adjacent substrate 110, 120 in two directions, x and z. For example, a side of the first substrate 110 facing in the direction x is offset from a side of the upper-most second substrate 129 facing in the direction x. Likewise, a side of the first substrate 110 facing in the direction z is offset from a side of the upper-most second substrate 129 facing in the direction z.

FIG. 7 illustrates a stacked semiconductor package 100 similar to that of FIG. 1. Some elements are omitted for clarity. In FIG. 7, a plurality of second substrates 120 are stacked on a protective layer 150, and a first substrate 110 is stacked on a top-most substrate 129 of the plurality of second substrates 120. Each second substrate 120 may be offset from an adjacent second substrate 120 by either a same distance or a distance different than another pair of adjacent second substrates 120. For example, an end of substrate 702 facing direction x may be offset from an end of substrate 703 facing direction x by a distance $d_1$. The end of substrate 703 facing direction x may be offset from an end of substrate 704 facing direction x by a second distance $d_2$. The difference in distances may be due to a different in substrate size, a difference in a number of exposed second connection pads 126, or any other suitable reason.

FIG. 7 further illustrates that one second substrate 120 may be of a different size than another second substrate 120. For example, substrate 702 may have a certain length $l_1$, while substrate 705 may have a length $l_2$ different from $l_1$. Different lengths may be due to the use of different types of semiconductor chips, for example.

An end 706 of the first substrate 110 may be located at a predetermined location relative to the lower-most substrate 121. Line A represents a center point of the lower-most substrate 121.

FIGS. 8A-8C illustrate different configurations of the first substrate 110 relative to the lower-most substrate 121. Line A represents a center line of the lower-most substrate in the direction x, and line B corresponds to an end 803 of the lower-most substrate opposite the connection region end 802.

As illustrated in FIG. 8A, an end 801 of the first substrate adjacent to the connection region 118 is less than halfway across the length of the lower-most substrate 121 in the x direction. In other words, the end 801 is between the end 802 of the lower-most substrate corresponding to the connection region 128 and the halfway line A of the lower-most substrate. Such a configuration may ensure stability as the semiconductor package 100 is stacked, or as an external device (not shown) is connected to the external connection terminals 114.

As illustrated in FIG. 8B, the end 801 of the first substrate 110 may be between the center line A of the lower-most substrate 121 and the line B corresponding to the end 803 of the lower-most substrate in the x direction. Such a configuration may result from a greater number of stacked second substrates 120, or a larger connection region 128 than the semiconductor package illustrated in FIG. 8A.

FIG. 8C illustrates an end 801 of the first substrate 110 located past the line B corresponding to the end 803 of the lower-most substrate 121 in the x direction. Such a configuration may result from a greater number of stacked second substrates 120, a larger connection region 128 than the semiconductor package illustrated in FIG. 8B, or utilizing second substrates 120 of various sizes, for example. However, such a configuration may create pressure on the adhesive layers (not shown) connecting the second substrates 120 or the first substrate 110 to the second substrates 120. Consequently, the molding 140 may be used to support the first and second substrates 110, 120. In addition, a supporting member 804 may be inserted beneath one or more of the first and second substrates 110, 120 at the ends opposite the connection regions 118, 128. A supporting member 804 may include any type of insulation or semiconductor material and may be of any shape.

Figure 9:
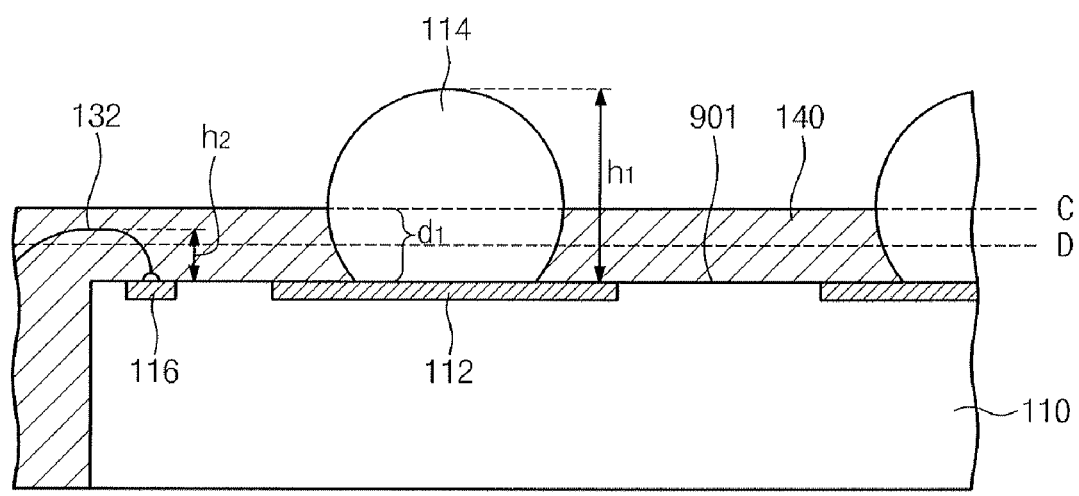
FIG. 9 illustrates a mold layer according to an embodiment of the present general inventive concept.

FIG. 9 illustrates the mold 140 covering the upper surface 901 of the first substrate 110. The layer of the mold 140 on the upper surface 901 of the first substrate 110 is thick enough to cover the wire 132 connecting the first substrate 110 to an adjacent substrate (not shown). The mold 140 also covers a portion of the external connection terminals 114 corresponding to the distance d1. In FIG. 9, distance d1 corresponds to line C, which is about half the height $h_1$ from the lower-most surface of the connection terminal 114 to the upper-most surface of the connection terminal 114. Distance d1 may be designed to cover any percentage of the connection terminal 114 less than 100%. For example, line D represents about 25% of the height $h_1$ of the connection terminal 114. The percentage of the connection terminal 114 covered by the mold 140 may be adjusted according to the specifications of the circuit, including the height $h_2$ of the wire 132 and connection terminals of an external device (not shown) to connect to connection terminals 114.

The foregoing is illustrative of the present general inventive concept and is not to be construed as limiting thereof. Although a few embodiments of the present general inventive concept have been described, those skilled in the art will readily appreciate that many modifications are possible in the embodiments without materially departing from the novel teachings and advantages of the present general inventive concept. Accordingly, all such modifications are intended to be included within the scope of the present general inventive concept as defined in the claims. The present general inventive concept is defined by the following claims, with equivalents of the claims to be included therein.

What is claimed is:

1. A semiconductor package comprising:
    a plurality of substrates having an offset stack structure and an uppermost substrate among the plurality of substrates includes an external connection terminal including a solder ball;
    a bonding wire electrically connecting the substrates;
    a molding layer to cover the plurality of substrates and to cover a first portion of the solder ball, and a second portion of the solder ball is exposed;
    a protection layer covering an inactive surface of a lower-most substrate among the plurality of substrates, and the inactive surface of the lowermost substrate is coplanar with one side of the molding layer; and a supporting member disposed between at least one substrate of the plurality of substrates that is not the lower-most substrate and the protection layer to support a region of the at least one substrate that is not stacked on another substrate.

2. The semiconductor package of claim 1, wherein the uppermost substrate is a printed circuit board and at least one of the plurality of substrates is an integrated circuit chip.

3. The semiconductor package of claim 1, wherein the plurality of substrates includes integrated circuit chip substrates.

4. The semiconductor package of claim 1, wherein the molding layer comprises epoxy molding compound and wherein the protection layer comprises polyimide.

5. The semiconductor package of claim 1, wherein the plurality of substrates is stacked in the shape of a stair so that a portion of an active surface of each of the substrates is exposed.

6. The semiconductor package of claim 5, wherein the bonding wire connects each substrate to a nearest adjacent substrate.

7. A semiconductor package, comprising:
a plurality of stacked substrates electrically connected to each other, each substrate of the plurality of stacked substrates being offset from an adjacent substrate in a first direction,
and the plurality of stacked substrates are stacked in a second direction substantially perpendicular to the first direction and include
an upper-most substrate having an external terminal connection including a solder ball on an upper-most surface;
a mold layer on the upper-most surface of the upper-most substrate, the mold layer covering a first portion of the solder ball adjacent to the upper-most surface, and a second portion of the solder ball being exposed;
a protection layer connected to a lower-most substrate of the plurality of stacked substrates; and
a supporting member disposed between at least one substrate of the plurality of stacked substrates that is not the lower-most substrate and the protection layer to support a region of the at least one substrate that is not stacked on another substrate.

8. The semiconductor package according to claim 7, wherein:
each of the plurality of stacked substrates comprises a first side and a second side adjacent to the first side;
the first side of each substrate is offset from an adjacent substrate in the first direction; and
the second side of each substrate is offset from an adjacent substrate in a third direction different from the first and second directions, the third direction being substantially perpendicular to the second direction.

9. The semiconductor package according to claim 7, wherein
the mold layer surrounds the plurality of stacked substrates other than the lower-most surface of the lower-most substrate.

10. The semiconductor package according to claim 7, further comprising:
a wire to connect a connection pad of the upper-most surface of the upper-most substrate to an adjacent substrate of the plurality of stacked substrates, wherein the mold layer covers the wire.

11. The semiconductor package according to claim 7, wherein each of the plurality of stacked substrates includes a first end including a connection region to connect to an adjacent substrate and a first side facing the first direction,
each of the plurality of stacked substrates includes a second side facing a direction opposite the first side, a length of each substrate being defined as a distance between the first side and the second side,
the plurality of stacked substrates includes an upper-most substrate and a lower-most substrate at an opposite end of the plurality of stacked substrates as the upper-most substrate, and
the first end of the upper-most substrate is between a midpoint of the length of the lower-most substrate and the second end of the lower-most substrate.

12. The semiconductor package according to claim 7, wherein the plurality of stacked substrates are offset from one another to form a stair shape in cross-section.

13. A semiconductor package, comprising:
a plurality of stacked substrates including an upper-most substrate having an upper-most surface, the upper-most surface including a connection pad and an external connection terminal including a solder ball to connect to an external device;
a wire to connect the connection pad of the upper-most substrate to an adjacent substrate of the plurality of stacked substrates;
a mold layer on the upper-most surface, the mold layer covering the wire and a first portion of the solder ball adjacent to the upper-most surface, and a second portion of the solder ball being exposed;
a protection layer connected to a lower-most substrate of the plurality of stacked substrates; and
a supporting member disposed between at least one substrate of the plurality of stacked substrates that is not the lower-most substrate and the protection layer to support a portion of the at least one substrate that is not stacked on another substrate.

14. The semiconductor package according to claim 13, wherein the upper-most substrate includes wiring to connect the connection pad to the external connection terminal.

15. The semiconductor package according to claim 13, wherein the mold layer covers a portion of the solder ball between 25% and 50% of the height of the solder ball.

16. A computing device, comprising:
a memory device comprising:
a plurality of stacked substrates electrically connected to each other, each substrate of the plurality of stacked substrates being offset from an adjacent substrate in a first direction, the plurality of stacked substrates being stacked in a second direction substantially perpendicular to the first direction and including an upper-most substrate having an upper-most surface, the upper-most surface including a connection pad and an external connection terminal including a solder ball to connect to an external device; and
a mold layer on the upper-most surface, the mold layer covering a first portion of the solder ball adjacent to the upper-most surface, and a second portion of the solder ball being exposed;
a protection layer connected to a lower-most substrate of the plurality of stacked substrates; and
a supporting member disposed between at least one substrate of the plurality of stacked substrates that is not the lowermost substrate and the protection layer to support a portion of the at least one substrate that is not stacked on another substrate; and
a controller electrically connected to the upper-most substrate of the plurality of stacked substrates via the external connection terminal to access each of the plurality of stacked substrates.

* * * * *